(12) United States Patent
Chan et al.

(10) Patent No.: US 7,195,021 B2
(45) Date of Patent: Mar. 27, 2007

(54) IN-SITU CLEANING OF LIGHT SOURCE COLLECTOR OPTICS

(75) Inventors: Michael Chan, Beaverton, OR (US);
 Robert Bristol, Portland, OR (US);
 Mark Doczy, Beaverton, OR (US)

(73) Assignee: Intel Corporation, Santa Clara, CA (US)

( * ) Notice: Subject to any disclaimer, the term of this patent is extended or adjusted under 35 U.S.C. 154(b) by 0 days.

(21) Appl. No.: 11/217,008

(22) Filed: Aug. 30, 2005

(65) Prior Publication Data

US 2006/0000489 A1 Jan. 5, 2006

Related U.S. Application Data

(62) Division of application No. 10/197,628, filed on Jul. 15, 2002.

(51) Int. Cl.
 *B08B 6/00* (2006.01)
(52) U.S. Cl. ............... 134/1.1; 134/1; 134/1.2; 134/1.3; 134/2; 134/25.4; 134/902; 134/216; 134/66; 134/67; 134/69; 134/75; 134/156; 134/345.5
(58) Field of Classification Search ........... 134/1, 134/1.1, 1.2, 1.3, 2, 25.4, 902; 156/345.5; 216/66, 67, 69, 75
See application file for complete search history.

(56) References Cited

U.S. PATENT DOCUMENTS

| | | | |
|---|---|---|---|
| 4,689,112 A | 8/1987 | Bersin | |
| 5,312,519 A | 5/1994 | Sakai et al. | |
| 5,336,366 A | 8/1994 | Cain et al. | |
| 6,031,598 A | 2/2000 | Tichenor et al. | |
| 6,153,044 A | 11/2000 | Klebanoff et al. | |
| 6,192,897 B1 | 2/2001 | Klebanoff et al. | |
| 6,450,116 B1 | 9/2002 | Noble et al. | |
| 6,533,952 B2 | 3/2003 | Klebanoff et al. | |
| 6,664,554 B2 | 12/2003 | Klebanoff et al. | |
| 6,772,776 B2 | 8/2004 | Klebanoff et al. | |
| 2003/0051739 A1 | 3/2003 | Klebanoff et al. | |
| 2004/0011381 A1 | 1/2004 | Klebanoff et al. | |

OTHER PUBLICATIONS

S. Graham, M.E. Malinowski, C.E. Steinhaus, P.A. Grunow and L.E. Klebanoff, "Studies of EUV Contamination Mitigation," Emerging Lithographic Technologies VI, Proceedings of SPIE vol. 4688, p. 431-441, (2002).

Malinowski et al., "Use of Molecular Oxygen to Reduce EUV-induced Carbon Contaminaton of Optics," Emerging Lithographic Technologies V, Proc. SPIE vol. 4343 pp. 347-356 (2001).

Malinowski, M., Klebanoff, L., Clift, M., Grunow, P., Steinhaus, C. "Carbon Deposition and Removal on Mo/Si Mirrors" (2000).

Johnson, E. D., Hulbert, S. L., Garrett, R. F., Williams, G. P. and Knotek, M. L. "In situ reactive glow discharge cleaning of x-ray optical surfaces," Review of Scientific Instruments vol. 58(6) pp. 1042-1045, Jun. 1987.

*Primary Examiner*—Zeinab El-Arini
(74) *Attorney, Agent, or Firm*—Fish & Richardson P.C.

(57) ABSTRACT

A method for cleaning optics in a chamber. The method can include introducing a first etchant into a chamber that encloses an optical component and a source of electromagnetic radiation that is suitable for lithography, ionizing the first etchant, and removing debris from a surface of the optical component.

32 Claims, 8 Drawing Sheets

IN-SITU CLEANING OF LIGHT SOURCE COLLECTOR OPTICS

CROSS-REFERENCE TO RELATED APPLICATIONS

This application is a divisional application of and claims priority to U.S. application Ser. No. 10/197,628, filed on Jul. 15, 2002, the contents of which are incorporated herein by reference.

This description relates to in-situ cleaning of light source collector optics.

BACKGROUND

Lithography is used in the fabrication of semiconductor devices. It is the technique by which the patterns that make up the circuitry of a chip are defined. In lithography, a light-sensitive material coats a wafer substrate, such as silicon, that is exposed to light at some wavelength to reproduce an image of the mask that is used to define each die on the wafer. The mask is usually referred to as a reticle in optical lithography, in that it is separated from the wafer by a series of objective lenses. When the wafer and mask are illuminated, the light-sensitive material, or photoresist, undergoes chemical reactions to produce a replicated pattern of the mask on the wafer. The patterns can then be manipulated in ways to transform the structure or properties of the wafer, which leads to the creation of various semiconductor devices and applications.

The source of the light used in lithography, for example, can be an excimer laser light sources at wavelengths of 248 nm, 193 nm or 157 nm. Extreme Ultraviolet (EUV) light sources, which produce light with a wavelength of approximately 13 nm, can also be used.

EUV light can be produced using a small, hot plasma which will efficiently radiate at a desired wavelength, for example 13.4 nm. The plasma is created in a vacuum chamber, typically by driving a pulsed electrical discharge through the target material, or by focusing a pulsed laser beam onto the target material. The light produced by the plasma is then collected by nearby mirrors and sent downstream to the rest of the lithography tool.

The hot plasma tends to erode any materials nearby, for example the electrodes in electric-discharge sources, or components of the gas delivery system in laser-produced plasmas. The eroded material may then coat the collector optics, resulting in a loss of reflectivity and reducing the amount of light available for lithography.

The collector optics may be replaced once they are coated with a given level of debris. Alternatively, the collector optics could be cleaned, for example, by temporarily removing them from the system for cleaning. The optical components may then be put back in the EUV system, and recalibrated and realigned.

DRAWINGS

Figure 5:
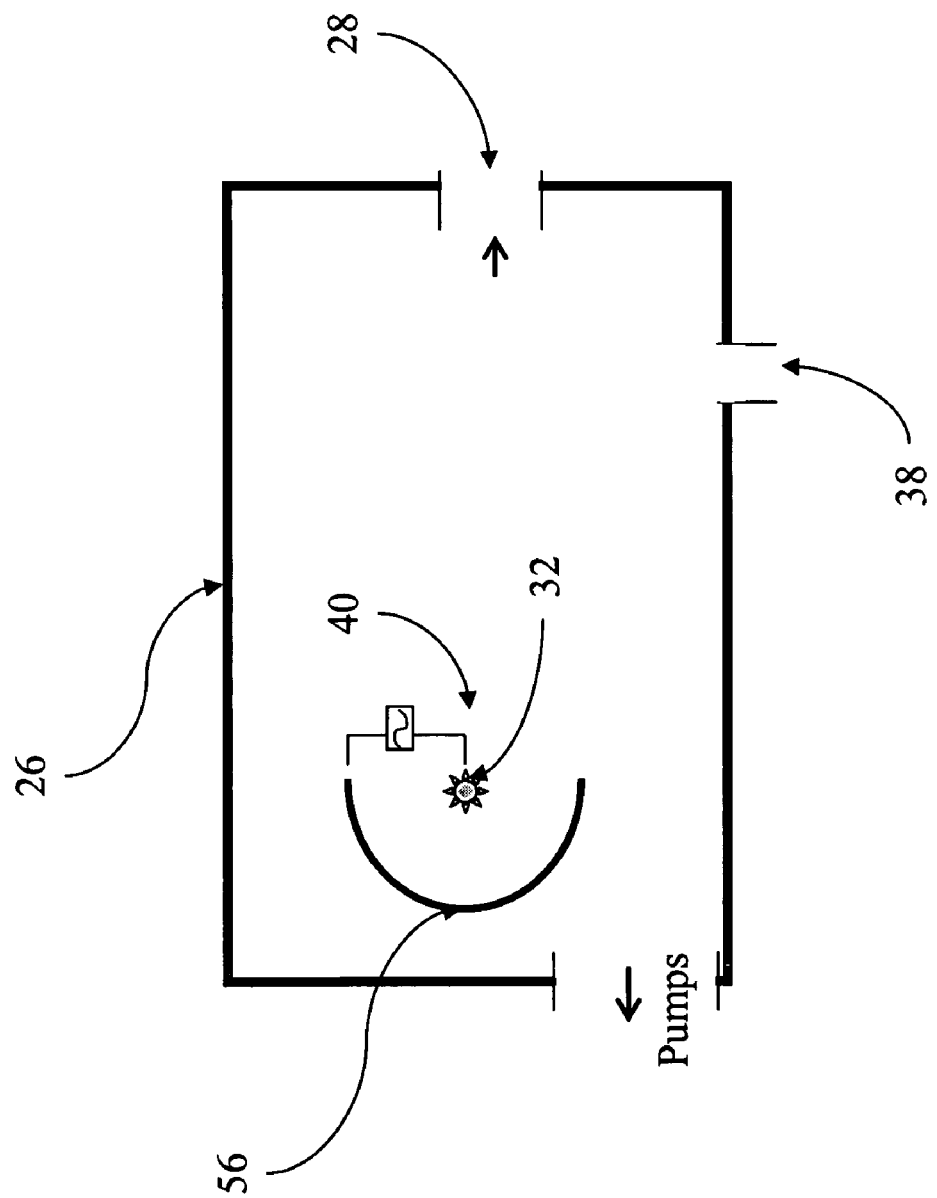
Figure 6:
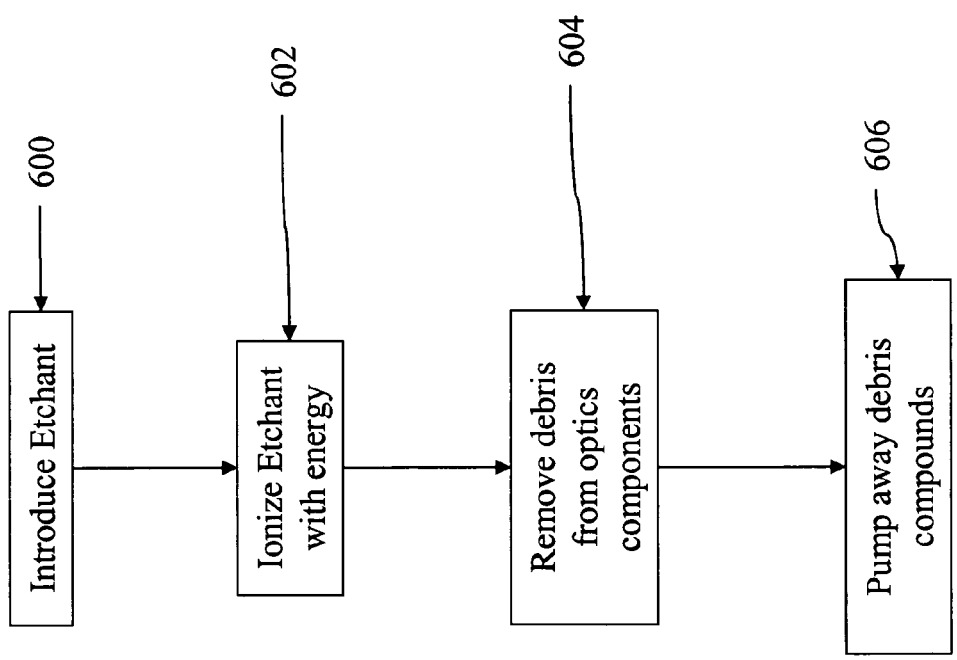
Figure 7:
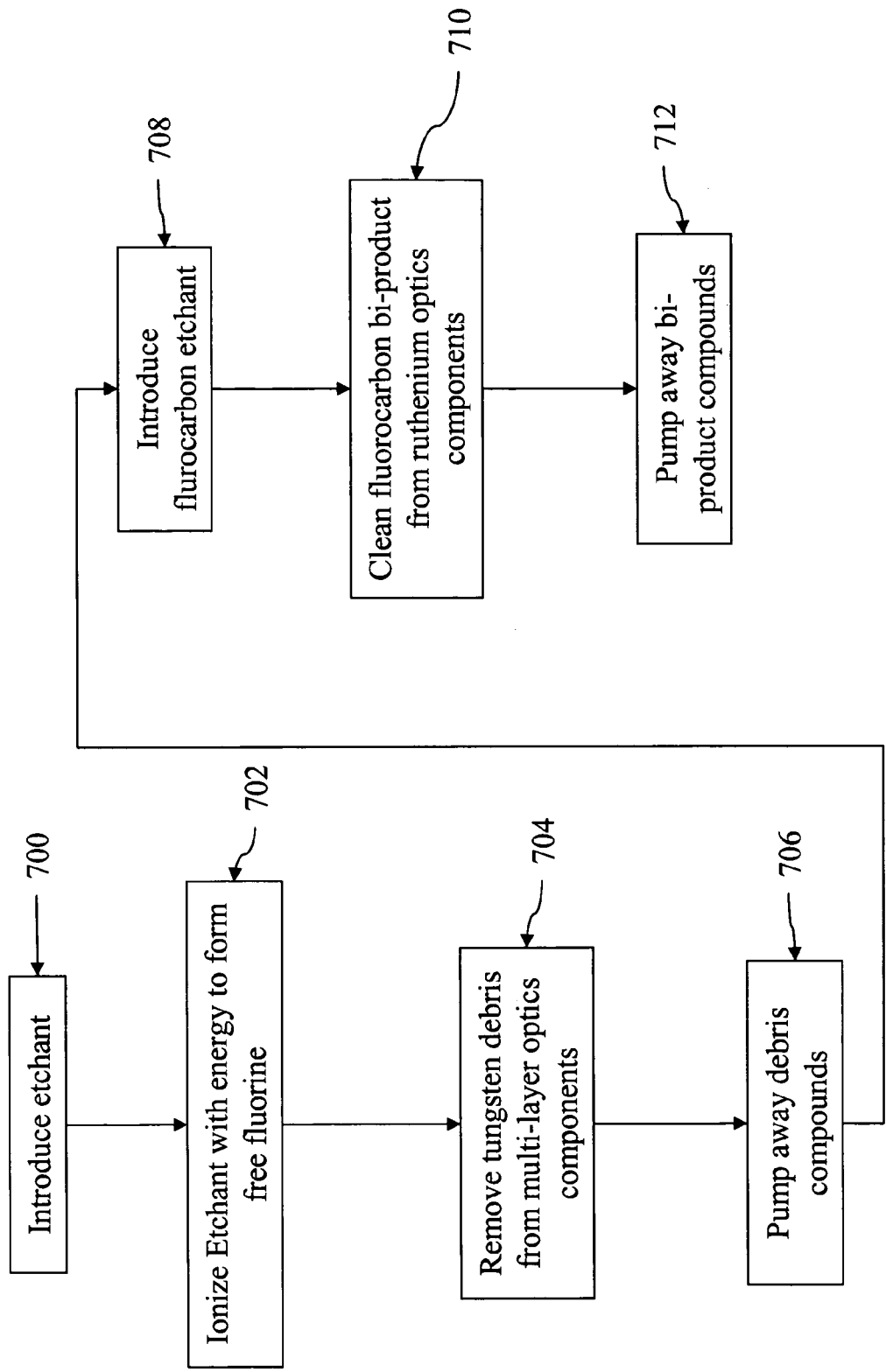
Figure 8:
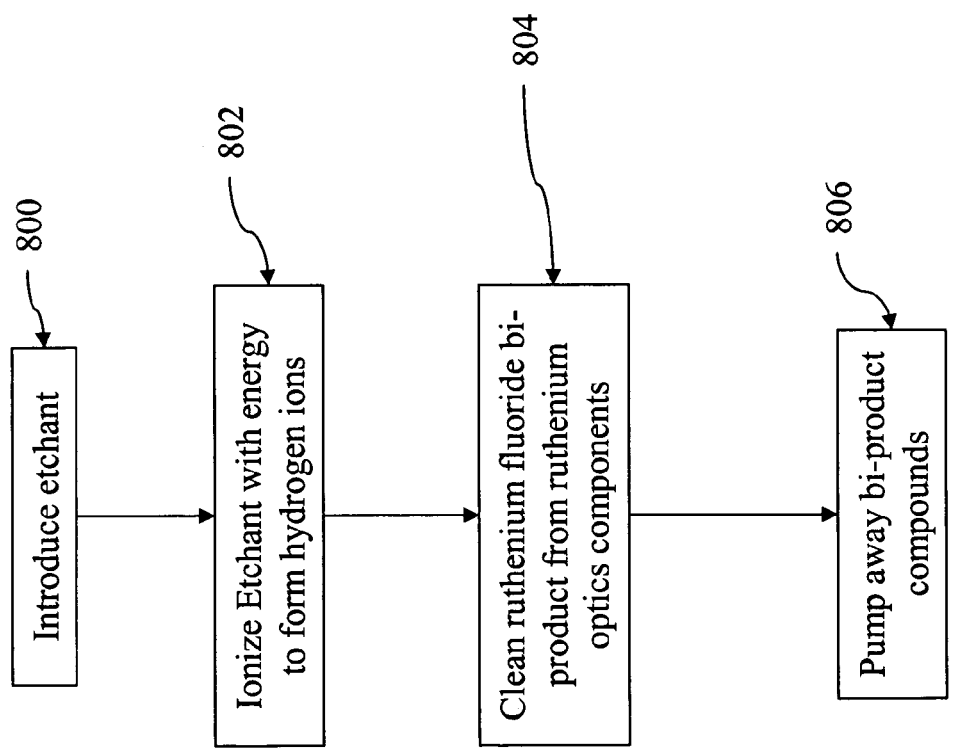

FIGS. 4(a)–(d) show alternative embodiments of an EUV chamber, modified for etching, including collector optics in a grazing incidence configuration;

FIG. 5 shows a EUV chamber, modified for etching, including collector optics in a normal incidence configuration;

FIG. 6 is a flowchart for a method of removing debris from lithography optics;

FIG. 7 is a flowchart for a method of removing byproduct from EUV lithography optics; and FIG. 8 is a flowchart for a method of removing byproduct from EUV lithography optics.

DETAILED DESCRIPTION

Figure 1:
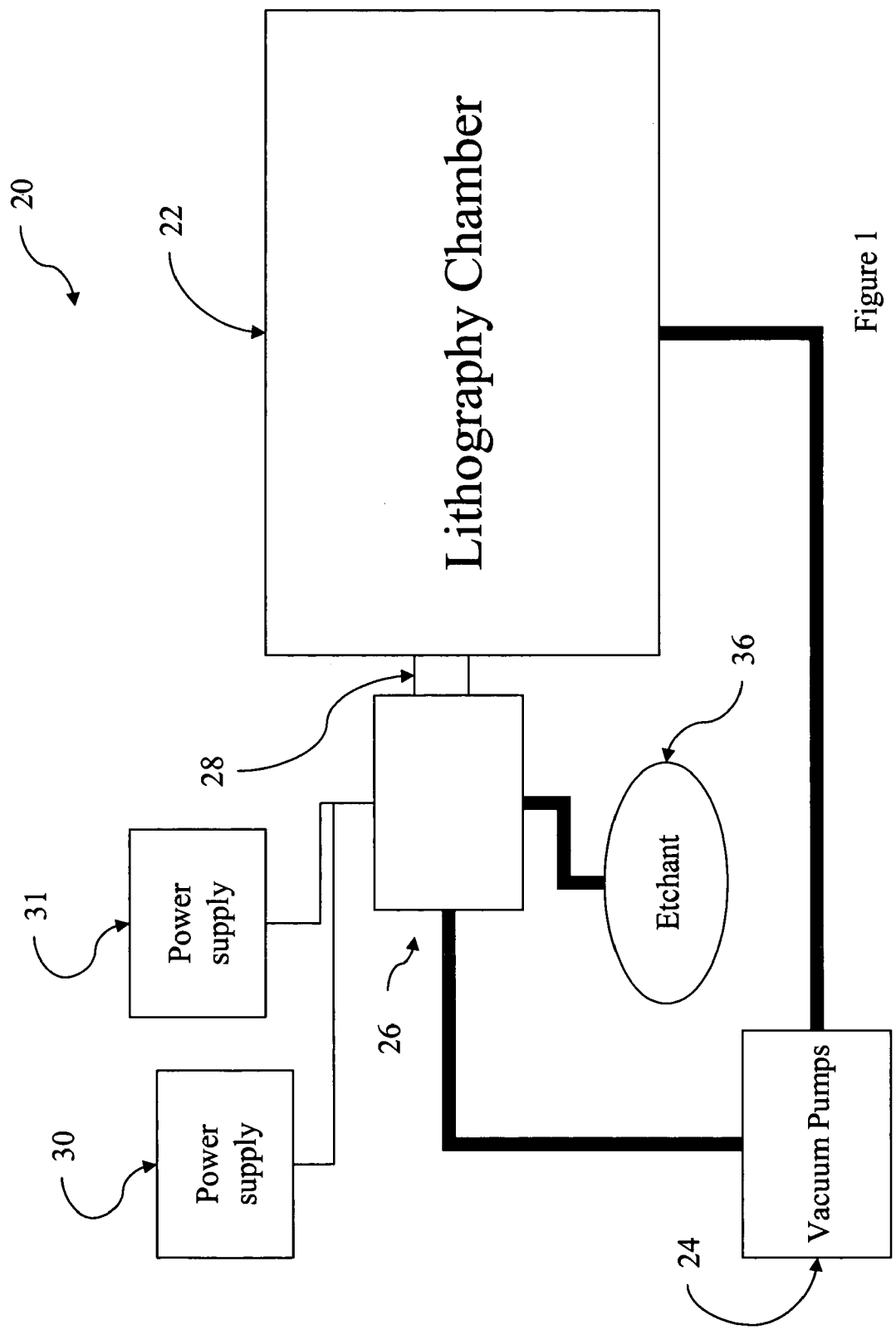
FIG. 1 shows a lithography system.

FIG. 1 shows a lithography system 20. The wafer with the light sensitive coating and the mask are placed in the lithography chamber 22. The pressure in the lithography chamber 22 is reduced to a near vacuum environment by vacuum pumps 24. A light source chamber 26, which houses a light source, is connected to the lithography chamber 22. The pressure in the light source chamber 26 is also reduced to a near vacuum environment by vacuum pumps 24. The light source chamber 26 and lithography chamber 22 are separated by a valve 28 that can be used to isolate the chambers 22, 26. This allows for different environments within each chamber.

The light source chamber 26 can be a EUV chamber, which houses a EUV light source. A power supply 30 is connected to the EUV chamber 26 to supply energy for creating a EUV photon emitting plasma, which provides EUV light for lithography. The light source chamber is evacuated by vacuum pumps 24.

Figure 2:
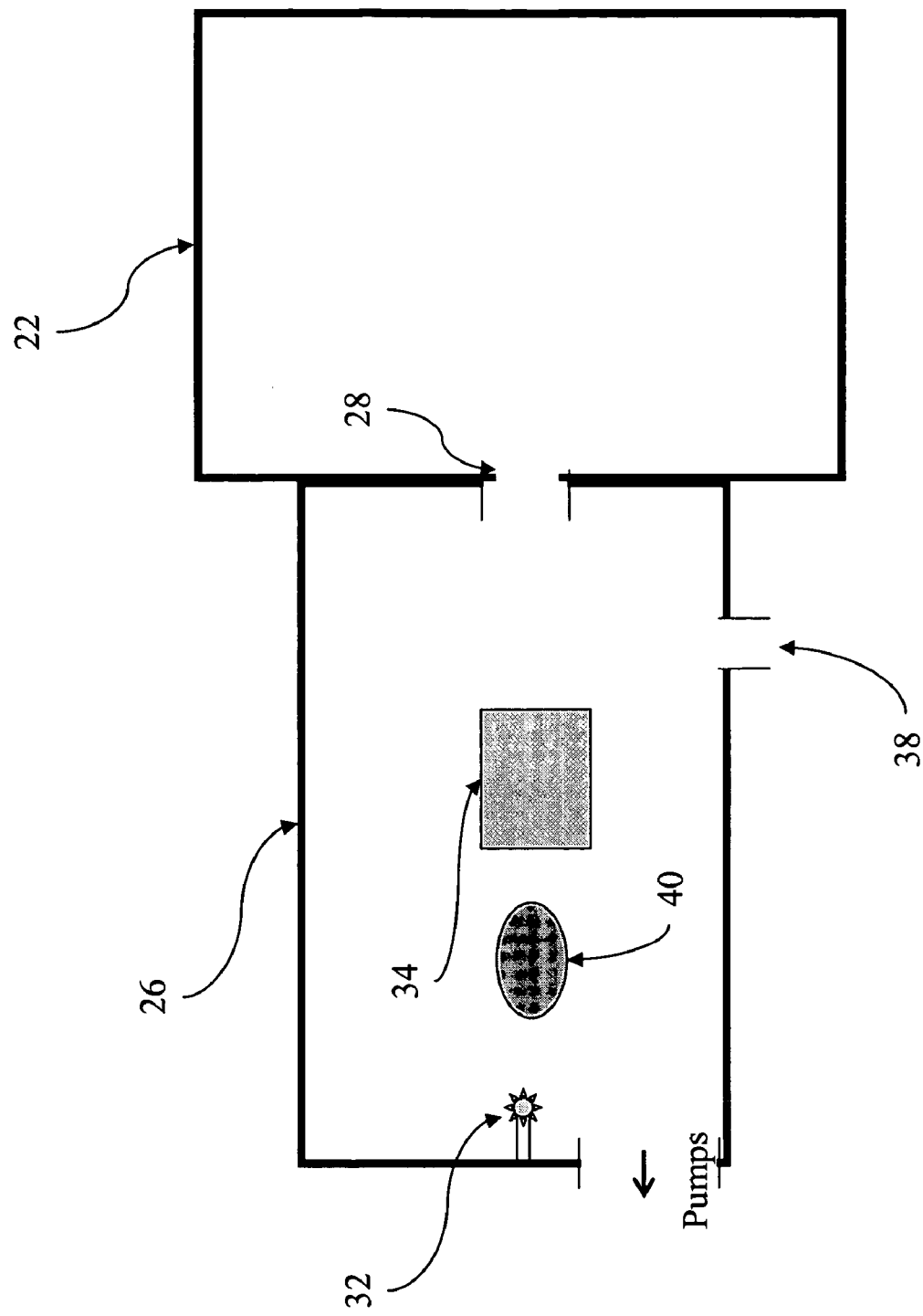
FIG. 2 shows a light source chamber.

FIG. 2 shows the light source chamber 26 connected to the lithography chamber 22. (The valve 28 is shown open.) Inside the light source chamber 26 is a light source 32 and collector optics 34 for collecting and directing the light for use in the lithography chamber 22. As described above, debris may be deposited on the collector optics 34. The collector optics 34 can be cleaned without removing them from the light source chamber 26.

To clean the optics, the light source chamber 26 is first isolated from the lithography chamber 22 by closing the isolation valve 28. The pressure in the light source chamber 26 is reduced using vacuum pumps 24 (FIG. 1), which may be the same pumps as used during light production, or different pumps. An etchant, or chemical reagent used in etching, is supplied from an etchant tank 36 (FIG. 1) to the light source chamber 26 through an etchant valve 38. Etching involves electrically driving a chemical reaction between gaseous reagents introduced into the light source chamber 26 and a surface, such as the surfaces of the collector optics 34. Here, for example, the etchant is ionized to form a plasma 40 by introducing electrical energy from a power supply. The power supply can be the light source power supply 30, or a separate etching power supply 31 (FIG. 1). Alternatively, laser energy could also be used to drive the ionization. The ions in the plasma 40 react with the debris on the surface of the collector optics 34, forming stable gaseous compounds. These stable compounds are then pumped away using the vacuum pumps 24 (FIG. 1). Then the value 28 can be reopened and photolithography can proceed again.

The collector optics can be, for example, grazing incidence mirrors. In a grazing incidence collector configuration, nested shells of mirrors are placed between the source 32 and the isolation valve 28. For example, each shell may be an ellipse of rotation, with the source at one focus of the ellipse, which is then re-imaged at the other focus of the ellipse. Parabolic shells produce a collimated beam of light. More complicated geometries of nested-shell mirrors are also possible.

Figure 3:
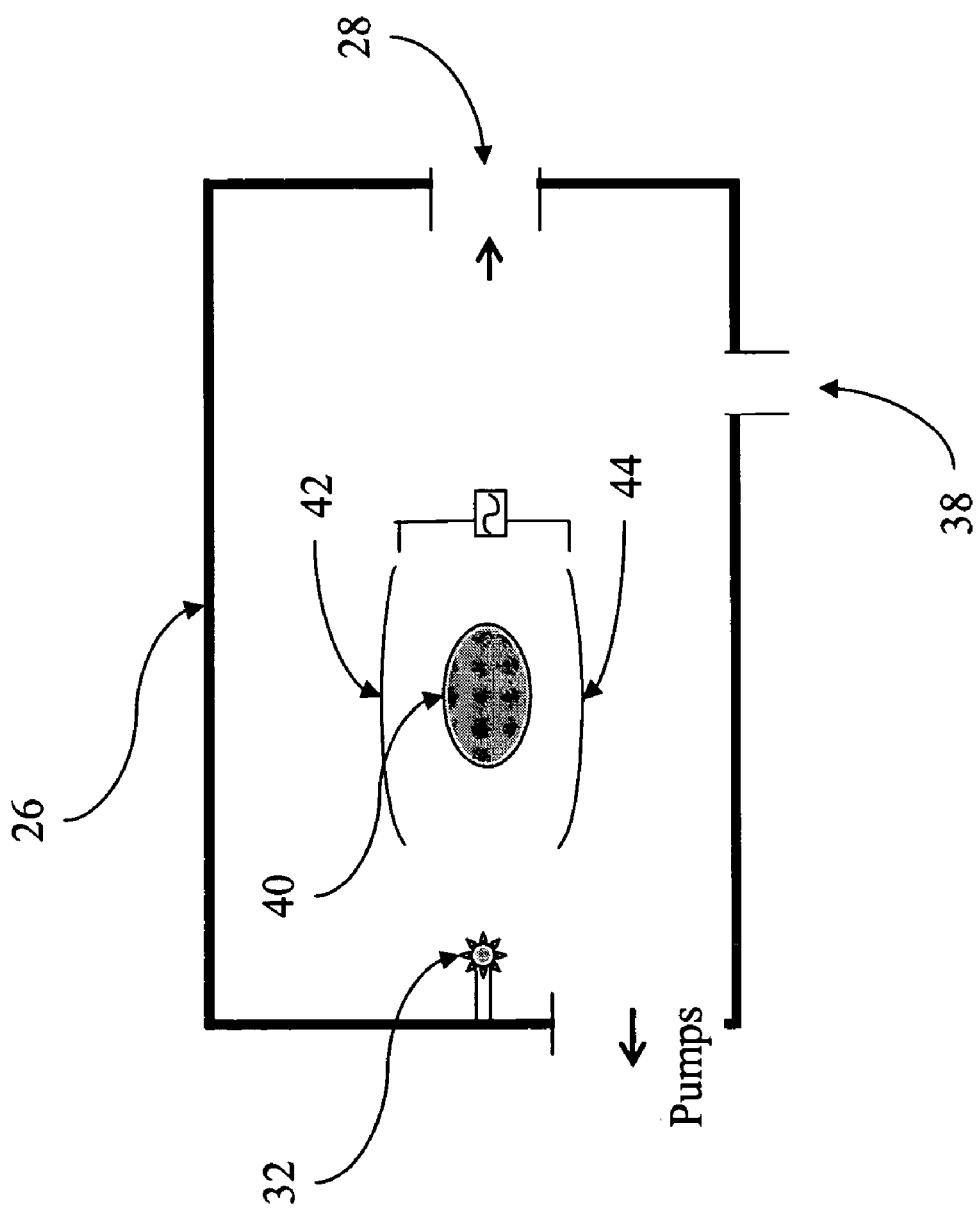
FIG. 3 shows a EUV chamber, modified for etching, including collector optics in a grazing incidence configuration.

Grazing-incidence mirrors can have a metallic surface, allowing the mirrors to be used as electrodes for the purposes of ionizing an etchant gas. FIG. 3 shows an example of a single mirror-shell, electrically split into two halves, 42 and 44. FIG. 3 shows a cross-section of the two parts of the mirror-shell. The complete un-sectioned shell is an essentially closed three-dimensional elliptical surface that is split longitudinally to form the two halves 42, 44. By holding the segments 42 and 44 at different voltages, the etchant can then be ionized to create the plasma 40 between the two mirrors 42, 44. The electrical energy can be supplied, for example, at microwave or radio frequency (RF).

Figure 4:
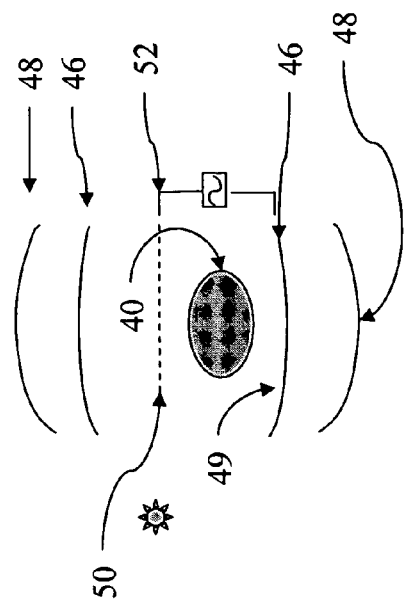
Figure 4:
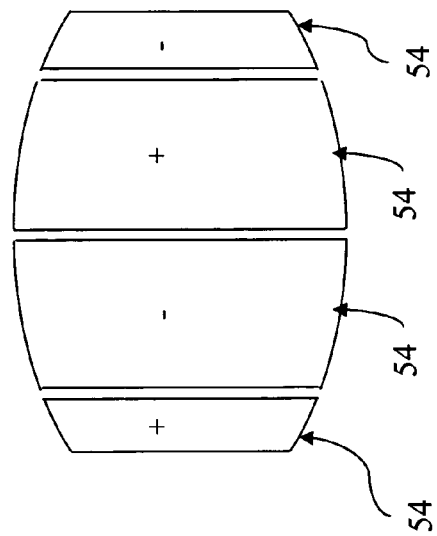
Figure 4:
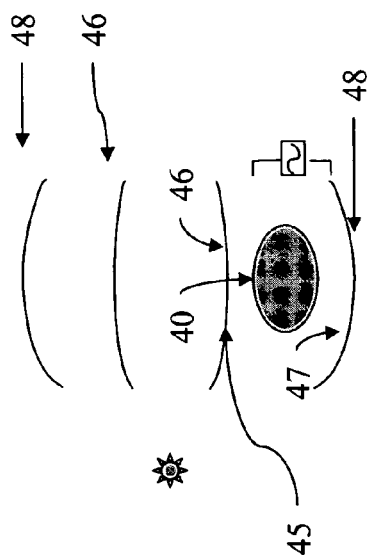
Figure 4:
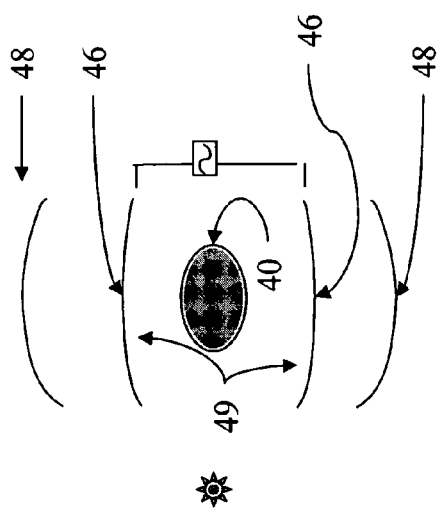

FIGS. 4(*a*)–4(*d*) show other possible grazing incidence mirror configurations where the mirrors are nested (and are, as in FIG. 3, shown in section). The mirrors here can be cleaned in stages. For example, the back side 45 (side further from the plasma 40) of the inner mirror 46 and the front side 47 (side closer to plasma 40) of the outer mirror 48 can be cleaned by creating a plasma between those surfaces as shown in FIG. 4(*a*). Here, the inner 46 and outer 48 mirrors are used as the electrodes. The front side of the inner mirrors 46 can be cleaned by creating a plasma 40 between the front surface 49 of the mirror 46 and a centerline 50 between the two inner mirrors, as shown in FIG. 4(*b*). Here, the inner mirror 46 is used as an electrode, and another electrode 52 is placed at the centerline. Alternatively, the front sides 49 of the inner mirrors 46 can be cleaned by creating a plasma 40 between the two inner mirrors 46, as shown in FIG. 4(*c*). Here, the two inner mirrors 46 are used as electrodes.

Instead of etching in multiple stages, as described above, the mirrors can be simultaneously etched by ensuring that the various mirror components are at the appropriate phases of the alternating voltage. For example, in FIG. 4*a*, the lower segment of mirror 48 can be at a positive voltage while the lower segment of 46 is at a negative voltage, while at the same time the upper segment of 46 is at positive voltage and the upper segment of 48 is at a negative voltage.

A segmented mirror configuration can also be used. A surface view of a segmented mirror is shown in FIG. 4(*d*). In this configuration, each of the mirrors is divided into multiple segments 54 along its length. Neighboring segments are held at opposite potentials to ionize the etchant. The segments can also be split along the lengthwise direction. Combinations of segmenting and nesting can also be used.

A normal-incidence mirror configuration, shown in FIG. 5, can also be used to direct the light into the lithography chamber 22. Here, the mirror 56 is a section of a rotated ellipse, parabola, or more complicated shape, that surrounds the source 32, causing the individual light rays to re-direct an angle close to 180 degrees. Nested and segmented configurations, similar to those described for grazing-incidence collectors, can also be used. Alternatively, the source itself 32 can be used as one of the electrodes, with the mirror 56 as the other electrode held at opposite voltage.

By introducing other metallic pieces into the chamber, many other mirror-electrode combinations are possible for both grazing-incidence and normal-incidence mirror configurations.

Mirrors in a grazing-incidence configuration require a smooth surface of certain EUV-reflective metals. Ruthenium, for example, can be used, as it is relatively tough and has a high grazing-incidence EUV reflectance. Normal-incidence mirrors require a multilayer coating, such as multiple layers of Si and Mo, to be reflective to EUV. A protective capping layer of another material can also be used with the multi-layer mirrors, for example, ruthenium or $SiO_2$.

The debris deposited on the mirrors can be composed of the materials making up the plasma-facing components of the EUV source. For example, tungsten (W) can be used for such components, as it is relatively resistant to plasma erosion. Specifically, tungsten can be used in the electrodes of an electric-discharge source and in the heat shields surrounding the gas-delivery system of a laser-produced plasma. The debris deposited on the mirrors determines the etchant that can be used to clean the mirrors.

The etchant is chosen such that when ionized, the ions react with the debris to form a volatile substance, which is gaseous in the light source chamber, while not reacting with the mirror surfaces to form volatile substances. Volatile substances are those that assume a gaseous form in the environment inside the light source chamber. If the debris deposited on the mirrors is tungsten, a fluorine-containing gas can be used as an etchant. Ruthenium and $SiO_2$, examples of materials that can be used in the mirrors, do not react with fluorine atoms to form volatile substances. Examples of fluorine-containing gases include $SF_6$, $F_2$, $XeF_2$ and $NF_3$. Other fluorine-containing gases can be used as well. As FIG. 6 shows, the etchant is introduced into the chamber (step 600). It is then ionized to form free fluorine (step 602). The free fluorine is generated through plasma electron collisions with the etchant gas.

The free fluorine atoms then react with the solid tungsten debris to form tungsten-fluorine compounds such as tungsten hexafluoride (step 604). Tungsten hexafluoride is a relatively volatile compound, with a boiling temperature of about 20 C at 1 atm, and thus will be a gas that can be pumped out of the chamber (step 606).

If a multi-layer material is used in the mirrors, debris should be removed from only the outer or capping layer. This requires a more precise etch. If the debris includes tungsten, a fluorocarbon can be used as the etchant, as shown in FIG. 7. Examples of possible fluorocarbon etchants include $CF_4$, $CHF_3$, and $C_4F_8$, though there are many other possibilities. Fluorocarbon etchants can also be used for cleaning solid metal mirrors. The fluorocarbon etchant is introduced (step 700) and ionized to form free fluorine atoms (step 702).

The free fluorine atoms (F) react with the tungsten debris (step 704). Thus the tungsten is removed from the mirror and can be pumped away (step 706).

As a side effect of using fluorocarbon etchants, fluorocarbon chains such as $CF_2$ and $CF_3$ can form with tungsten, leaving a residue on the surface of the mirrors. A second plasma can be created to remove this residue from the mirrors. Hydrogen or oxygen can be introduced as etchants for the second plasma (step 708). Free hydrogen or oxygen is generated through plasma electron collisions with the etchant gas. The free oxygen or hydrogen reacts with the fluorocarbon-tungsten compounds. Methane ($CH_4$) or carbon monoxide (CO) is formed along with a tungsten-flourine compound (such as tungsten hexaflouride) and both are pumped out of the chamber.

Generation of EUV light can also crack hydrocarbon chains. Thus in addition to tungsten, carbon debris can then be deposited on the optical components. A plasma created using an oxygen etchant can be used to remove the carbon debris.

If the debris deposition is not uniform across the mirror, there may be regions of exposed mirror without debris on top that can potentially react with the fluorine atoms. For example, if the mirror is made of ruthenium, the areas on the mirror surface not covered by debris can potentially react with the fluorine atoms to form ruthenium fluoride on the mirror surface. An additional plasma can be created to clean the ruthenium fluoride, as FIG. 8 shows. Hydrogen reactive ion etching (RIE) at room temperature, where hydrogen is used as the etchant, can be used to remove the ruthenium fluoride from the mirror without reacting with the ruthenium on the mirror surface. Hydrogen is introduced into the chamber (step 800), is ionized (step 802) and reacts with ruthenium fluoride to form HF gas (step 804), which can be readily pumped away from the chamber (step 806), leaving a clean ruthenium surface.

If the debris deposited on the mirrors is a material other than tungsten, the etchant can be chosen such that when ionized, free ions in the plasma react with the debris to form gaseous compounds, which can be pumped away.

An alternative to reacting a plasma with debris on the mirror surfaces is to sputter debris off the mirror surfaces. In this case, a high-energy plasma is created in the light source chamber. The plasma ions strike the surface of the collector optics and dislodge particles of debris such as tungsten, aluminum, copper, and other impurities. The energy and composition of the ions are be tuned so as to minimize the damage to the mirror surface and maximize the damage to the debris. A sputtering plasma can be created with any of the mirror configurations described above. Also, sputtering may be used in conjunction with the other methods described above.

Although some implementations have been described above, other embodiments are also within the scope of the invention.

What is claimed:

1. A method comprising:
   introducing a first etchant into a chamber that encloses an optical component and a source of electromagnetic radiation that is suitable for lithography;
   ionizing the first etchant; and
   removing debris from a surface of the optical component.
2. The method of claim 1, wherein the source of electromagnetic radiation comprises an extreme ultraviolet source.
3. The method of claim 1, wherein introducing the first etchant comprises introducing a fluorine-containing gas.
4. The method of claim 3, wherein introducing the first etchant comprises introducing a compound from the group consisting of $NF_3$, $F_2$, $XeF_2$, and $SF_6$.
5. The method of claim 1, wherein introducing the first etchant comprises introducing a fluorocarbon.
6. The method of claim 5, wherein introducing the first etchant comprises introducing a compound from the group consisting of $CF_4$, $CHF_3$, and $C_4F_8$.
7. The method of claim 1, wherein ionizing the first etchant comprises using radio frequency energy.
8. The method of claim 1 wherein ionizing the first etchant comprises using microwave energy.
9. The method of claim 1, wherein ionizing the first etchant comprises providing a bias between the source of lithographic electromagnetic radiation and the surface of the optical component.
10. The method of claim 1, wherein removing debris from the surface comprises removing a metal from the optical component surface.
11. The method of claim 10, wherein removing the metal comprises removing a tungsten compound from the surface.
12. The method of claim 1, also comprising:
    introducing a second etchant into the chamber;
    ionizing the second etchant; and
    removing a byproduct, caused by reacting the first etchant with the optical component surface, from the surface of the optical component.
13. The method of claim 12, wherein introducing the second etchant comprises introducing hydrogen or oxygen.
14. The method of claim 12, wherein removing the byproduct comprises reacting the ionized second etchant with the byproduct to form an etchant-byproduct compound.
15. The method of claim 1, wherein removing debris from the surface of the optical component comprises reacting the ionized etchant with the debris to form an etchant-debris compound.
16. The method of claim 1, wherein introducing the first etchant comprises introducing a fluorocarbon etchant into the chamber.
17. The method of claim 1, wherein the optical component comprises a grazing incidence collector of extreme ultraviolet radiation.
18. The method of claim 1, further comprising fabricating a device using the source of lithographic electromagnetic radiation and the optical component.
19. The method of claim 18, wherein fabricating the device comprises lithographically fabricating a semiconductor device.
20. A method comprising:
    generating a lithographic electromagnetic radiation in a chamber enclosing an optical component and a source of the lithographic electromagnectic radiation; and
    cleaning the optical component without removing the optical component from the chamber.
21. The method of claim 20, wherein cleaning the optical component comprises introducing a cleaning compound into the chamber.
22. The method of claim 21, wherein cleaning the optical component comprises electrically ionizing the cleaning compound.
23. The method of claim 22, wherein cleaning the optical component comprises reacting the electrically ionized cleaning compound with debris on the optical component.
24. The method of claim 20, wherein generating the electromagnetic radiation comprises creating a plasma using a set of electrodes.
25. The method of claim 24, further comprising electrically ionizing a cleaning compound using the set of electrodes.
26. The method of claim 20, wherein cleaning the optical component comprises exposing the optical component to an ionized fluorine-containing gas.
27. The method of claim 20, wherein cleaning the optical component further comprises exposing the optical component to at least one of a hydrogen-containing gas and a oxygen-containing gas after exposure to the ionized fluorine-containing gas.
28. The method of claim 20, wherein cleaning the optical component comprises exposing the optical component to an ionized fluorocarbon etchant.
29. The method of claim 20, wherein cleaning the optical component comprises cleaning a grazing incidence collector of extreme ultraviolet radiation.
30. The method of claim 20, wherein generating electromagnetic radiation comprises generating an extreme ultraviolet radiation.
31. The method of claim 20, further comprising fabricating a device using the electromagnetic radiation and the optical component.
32. The method of claim 31, wherein fabricating the device comprises lithographically fabricating a semiconductor device.

* * * * *